(12) United States Patent
Kim

(10) Patent No.: US 10,431,625 B2
(45) Date of Patent: Oct. 1, 2019

(54) IMAGE SENSOR AND METHOD OF FABRICATING THE SAME

(71) Applicant: SK hynix Inc., Gyeonggi-do (KR)

(72) Inventor: Byoung-Gyu Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/796,994

(22) Filed: Oct. 30, 2017

(65) Prior Publication Data

US 2018/0294310 A1 Oct. 11, 2018

(30) Foreign Application Priority Data

Apr. 10, 2017 (KR) .................. 10-2017-0045829

(51) Int. Cl.
 *H01L 27/146* (2006.01)
 *H04N 5/361* (2011.01)
(52) U.S. Cl.
 CPC .... *H01L 27/14698* (2013.01); *H01L 27/1461* (2013.01); *H01L 27/1463* (2013.01); *H04N 5/361* (2013.01); *H01L 27/14645* (2013.01)
(58) Field of Classification Search
 CPC ................................. H01L 27/14698
 See application file for complete search history.

(56) References Cited

U.S. PATENT DOCUMENTS

| | | | | |
|---|---|---|---|---|
| 5,258,332 | A | * | 11/1993 | Horioka ............ H01L 21/3065 257/E21.218 |
| 2004/0102017 | A1 | | 5/2004 | Chang et al. |
| 2007/0190741 | A1 | * | 8/2007 | Lindsay ............ H01L 21/26506 438/424 |
| 2009/0278181 | A1 | * | 11/2009 | Tanaka ............ H01L 27/14603 257/292 |
| 2010/0110239 | A1 | * | 5/2010 | Ramappa ......... H01L 27/14603 348/243 |
| 2011/0260280 | A1 | * | 10/2011 | Chuang ............ H01L 27/1464 257/460 |

FOREIGN PATENT DOCUMENTS

KR   1020140141822   12/2014

* cited by examiner

*Primary Examiner* — Thao X Le
*Assistant Examiner* — Laura M Dykes
(74) *Attorney, Agent, or Firm* — IP & T Group LLP

(57) ABSTRACT

An image sensor may include: a trench formed in a substrate; an impurity region formed in the substrate to be in contact with the trench; and a re-crystallization layer formed in the substrate to be in contact with bottom and side surfaces of the trench and a surface of the substrate. The re-crystallization layer may contain one or more kinds of elements different from an element constituting the substrate.

14 Claims, 9 Drawing Sheets

IMAGE SENSOR AND METHOD OF FABRICATING THE SAME

CROSS-REFERENCE TO RELATED APPLICATIONS

This application claims priority under 35 U.S.C. § 119 to Korean Patent Application No. 10-2017-0045829, filed on Apr. 10, 2017, in the Korean Intellectual Property Office, the disclosure of which is incorporated herein by reference in its entirety.

TECHNICAL FIELD

Various embodiments relate to a semiconductor device fabrication technology, and more particularly, to an image sensor and a method for fabricating the same.

DISCUSSION OF THE RELATED ART

An image sensor refers to a device that converts an optical image into an electrical signal. Recently, with the development of computer industry and communication industry, the demand for an enhanced image sensor with a high integration density is increasing in various fields such as a digital camera, a camcorder, a personal communication system (PCS), a game machine, a security camera, a medical micro-camera, and a robot.

SUMMARY

Various embodiments are directed to an enhanced image sensor capable of implementing a high-quality image by preventing occurrence of noise, and a method of fabricating the same.

In an embodiment, an image sensor may include: a trench formed in a substrate; an impurity region formed in the substrate to be in contact with the trench; and a re-crystallization layer formed in the substrate to be in contact with bottom and side surfaces of the trench and a surface of the substrate, wherein the re-crystallization layer contains one or more kinds of elements different from an element constituting the substrate. Furthermore, the image sensor may further include: a photoelectric conversion element formed in the substrate, wherein the photoelectric conversion element may include the impurity region.

The trench may have rounded corners. The re-crystallization layer may be continuously formed along the surface of the substrate, which includes the bottom and side surfaces of the trench. The substrate may include a light receiving region and a readout region, both of which are isolated from each other by the trench, and the element contained in the re-crystallization layer disposed in the light receiving region may be different from the element contained in the re-crystallization layer disposed in the readout region. The element constituting the substrate may include silicon, and the one or more kinds of elements different from the element constituting the substrate may include one or more of metalloid elements, nonmetallic elements, and combinations thereof among group 14 to 18 elements.

In an embodiment, an image sensor may include: a substrate having a first surface and a second surface facing the first surface; a trench formed at the first surface of the substrate; an impurity region formed in the substrate to be in contact with the trench; a first re-crystallization layer formed in the substrate to be in contact with bottom and side surfaces of the trench and the first surface of the substrate; and a second re-crystallization layer formed in the substrate to be in contact with the second surface of the substrate, wherein each of the first and second re-crystallization layers contains one or more kinds of elements different from an element constituting the substrate. Furthermore, the image sensor may further include: a photoelectric conversion element formed in the substrate, wherein the photoelectric conversion element may include the impurity region.

The trench may have rounded corners. The first re-crystallization layer may be continuously formed along the first surface of the substrate, which includes the bottom and side surfaces of the trench, and thee second re-crystallization layer may be continuously formed along the second surface of the substrate. The substrate may include a light receiving region and a readout region, both of which are isolated from each other by the trench, and the element contained in the first re-crystallization layer disposed in the light receiving region may be different from the element contained in the first re-crystallization layer disposed in the readout region. The element constituting the substrate may include silicon, and the one or more kinds of elements different from the element constituting the substrate may include one or more of metalloid elements, nonmetallic elements, and combinations thereof among group 14 to 18 elements.

In an embodiment, a method of fabricating an image sensor may include: forming a trench at a first surface of a substrate by etching the substrate having the first surface and a second surface facing the first surface; performing a primary ion-implantation process to form a first amorphous layer in the substrate such that the first amorphous layer is in contact with bottom and side surfaces of the trench and the first surface of the substrate; performing a primary anneal process to convert the first amorphous layer into a first re-crystallization layer; and forming an impurity region in the substrate such that the impurity region is in contact with the trench, wherein the primary ion-implantation process is performed using one or more kinds of elements different from an element constituting the substrate. Furthermore, the method of fabricating the image sensor may further include: forming a photoelectric conversion element in the substrate, wherein the photoelectric conversion element may include the impurity region.

After performing the primary ion-implantation process and performing the primary anneal process, the trench may have rounded corners. The substrate may include a light receiving region and a readout region, both of which are isolated from each other by the trench, and the element contained in the first re-crystallization layer disposed in the light receiving region may be different from the element contained in the first re-crystallization layer disposed in the readout region. The first re-crystallization layer may be formed in the substrate to be in contact with the bottom and side surfaces of the trench and the first surface of the substrate, and continuously formed along the first surface of the substrate, which includes the side and bottom surfaces of the trench. The element constituting the substrate may include silicon, and the one or more kinds of elements different from the element constituting the substrate may include one or more of metalloid elements, nonmetallic elements, and combinations thereof among group 14 to 18 elements.

Furthermore, the method of fabricating the image sensor may further include: performing a thinning process on the second surface of the substrate; performing a secondary ion-implantation process to form a second amorphous layer in the substrate such that the second amorphous layer is in contact with the second surface of the substrate; and performing a secondary anneal process to convert the second amorphous layer into a second re-crystallization layer, wherein the secondary ion-implantation process is performed using one or more kinds of elements different from the element constituting the substrate. The secondary anneal process may be performed for a shorter time than the primary anneal process.

DETAILED DESCRIPTION

Figure 1:
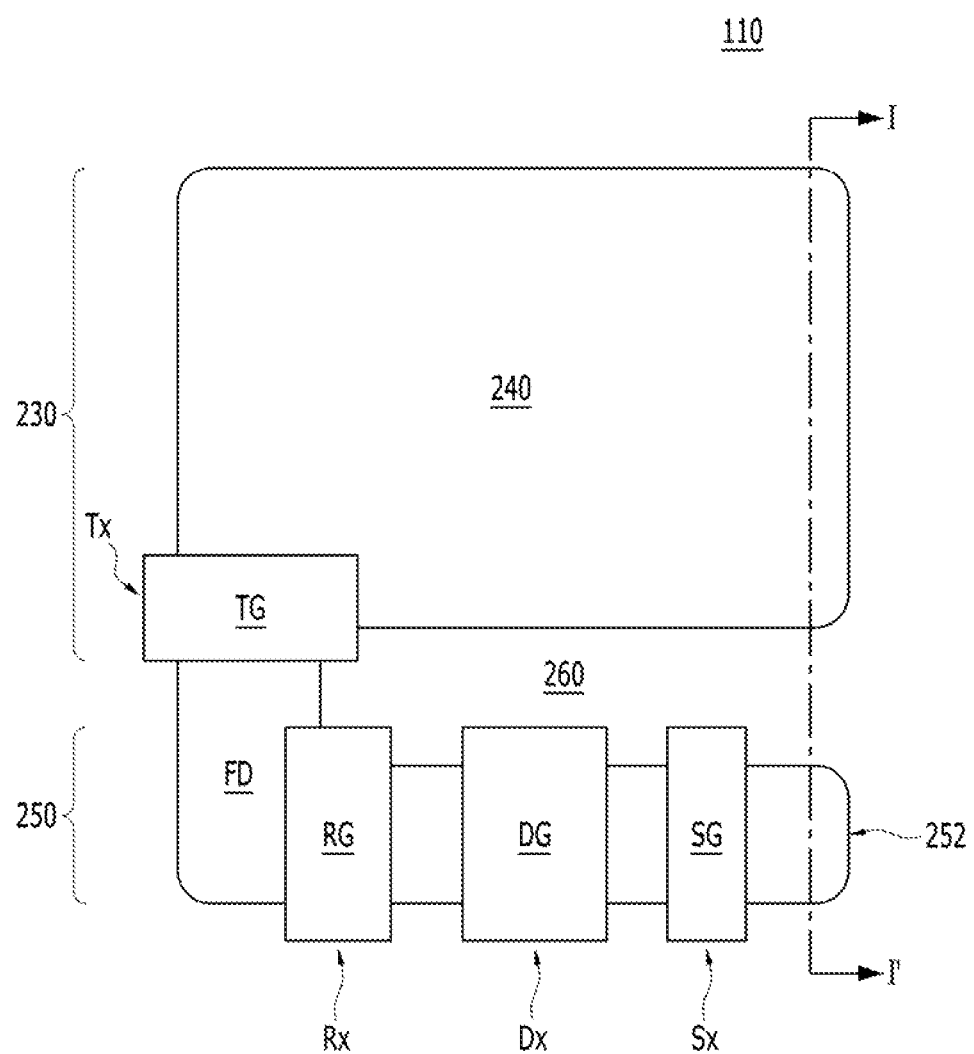
FIG. 1 is a plan view illustrating a unit pixel of an image sensor in accordance with an embodiment of the present invention.

Hereinafter, various embodiments of the present invention will be described in more detail with reference to the accompanying drawings. The drawings may not be necessarily to scale and in some instances, proportions of at least some of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers may exist between the first layer and the second layer or the substrate.

The various embodiments of the present invention provide an enhanced image sensor and a method of fabricating the same. More specifically, the various embodiments of the present invention provide an image sensor capable of implementing a high-quality image by preventing occurrence of noise and a method of fabricating the same. For reference, a dark current is a major reason that noise occurs in an image sensor. In general, the dark current is caused by a defect, which occurs in a substrate while fabricating the image sensor. Therefore, a post-treatment for removing the defect from the substrate is very important, the post-treatment being performed after a process of causing the defect in the substrate, for example, an etching process. The post-treatment may include a method of oxidizing the surface of the substrate, a hydrogen termination treatment, an anneal treatment, and the like. However, the above-described post-treatments can remove defects formed at the surface of the substrate, but may have difficulties in removing the defects formed in the substrate under the surface of the substrate, for example, dislocations and stacking faults.

Therefore, the embodiments of the present invention provide an image sensor capable of preventing the dark current and occurrence of noise, which is caused by the dark current, by effectively removing the defects formed at the surface of a substrate and the defects formed under the surface of the substrate, thereby implementing a high-quality image, and a method of fabricating the same. For this function, the various embodiments of the present invention may include a re-crystallization layer formed along the surface of the substrate having a predetermined structure formed therein.

Figure 2:
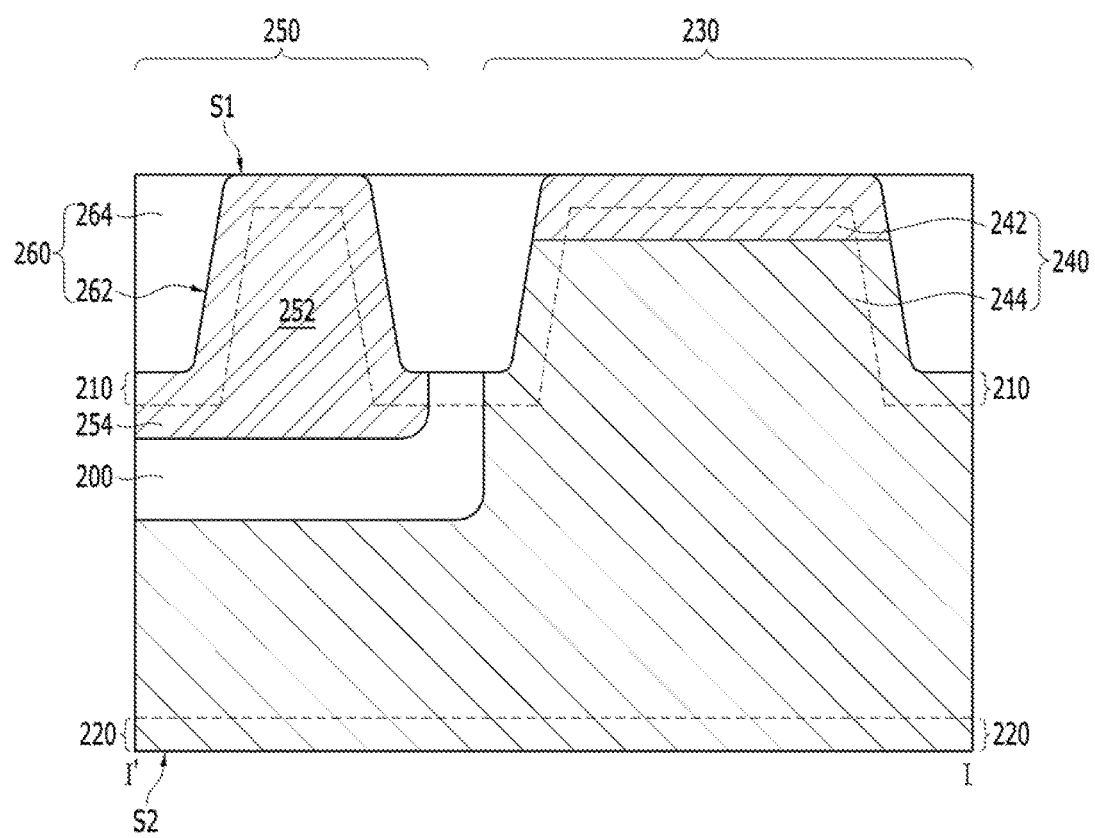
FIG. 2 is a cross-sectional view of the unit pixel of the image sensor, taken along the like I-I' of FIG. 1.

FIG. 1 is a plan view illustrating a unit pixel 110 of an image sensor in accordance with an embodiment of the present invention, and FIG. 2 is a cross-sectional view of the unit pixel 110 of the image sensor, taken along a I-I' line of FIG. 1.

As illustrated in FIGS. 1 and 2, the image sensor may include a substrate 200, a trench 262, an impurity region, and a first re-crystallization layer 210. The substrate 200 may have a first surface S1 and a second surface S2 facing the first surface S1 the trench 262 may be formed at the first surface S1 of the substrate 200, the impurity region may be formed in the substrate 200 to be in contact with the trench 262, and the first re-crystallization layer 210 may be formed in the substrate 200 to be in contact with bottom and side surfaces of the trench 262 and the first surface S1 of the substrate 200. The first re-crystallization layer 210 may be continuously formed along the first surface S1 of the substrate 200, which includes the bottom and side surfaces of the trench 262. That is, the first re-crystallization layer 210 may be formed as a one-body layer, which is continuously connected regardless of the formation position thereof. The substrate 200 may include a light receiving region 230 and a readout region 250 separated by the trench 262. The light receiving region 230 may include a photoelectric conversion element 240 formed in the substrate 200, and the readout region 250 may include a well 254 formed in the substrate 200. The photoelectric conversion element 240 and the well 254 may include the impurity region, which is formed in the substrate 200 to be in contact with the trench 262.

The image sensor may further include a second re-crystallization layer 220 formed in the substrate 200 to be in contact with the second surface S2 of the substrate 200. The second re-crystallization layer 220 may be continuous y formed along the second surface S2 of the substrate 200. In the embodiment of the present invention, the trench 262 is formed only at the first surface S1 of the substrate 200. However, the present embodiment is not limited thereto. For example, a trench may also be formed at the second surface S2 of the substrate 200. In this case, the second re-crystallization layer 220, like the first re-crystallization layer 210, may also be formed as a one-body layer, which is continuously connected regardless of the formation position thereof.

According to the embodiment of the present invention, in the image sensor, the first re-crystallization layer 210, during a process, may serve to remove defects formed at the first surface S1 of the substrate 200, which includes the bottom and side surfaces of the trench 262 and the defects formed under the first surface S1 of the substrate 200. Furthermore, the second re-crystallization layer 220, during a process, may serve to remove the defects formed at the second surface S2 of the substrate 200 and the defects formed under the second surface S2 of the substrate 200. Therefore, the first re-crystallization layer 210 and second re-crystallization layer 220 during the process may remove the defects formed at the surfaces S1 and S2 of the substrate 200 and the defects formed under the surfaces S1 and S2 of the substrate 200, thereby preventing the dark current and occurrence of noise, which is caused by the dark current. For this function, the first re-crystallization layer 210 and the second re-crystallization layer 220 may contain one or more kinds of elements different from an element constituting the substrate 200. Hereafter, the element constituting the substrate 200 will be referred to as a 'first element'. The first element may include silicon (Si) and the one or more kinds of elements different from the first element may include one or more of metalloid elements, nonmetallic elements, and combinations thereof among group 14 to 18 elements.

For example, the first re-crystallization layer 210 may contain second or third element different from the first element. The first re-crystallized layer 210 may partially contain the second or the third element different from the first element. For example, the second element may be contained in the first re-crystallization layer 210 disposed in the light receiving region 230, and the third element may be contained in the first re-crystallization layer 210 disposed in the readout region 250. In addition, the second re-crystallization layer 220 may also contain the second or the third element different from the first element. The second re-crystallized layer 220 may partially contain the second or the third element different from the first element.

The second element may include group 18 elements, and the third element may include group 14 to 17 elements. For example, the second element may include any one or combinations of helium (He), neon (Ne), argon (Ar), krypton (Kr), xenon and radon (Rn). The third element may include any one or combinations of carbon (C), silicon (Si), germanium (Ge), nitrogen (N), oxygen (O), and fluorine (F). When each of the first re-crystallization layer 210 and the second re-crystallization layer 220 contains the second element, the defects formed in the substrate 200 for example, dislocations or stacking faults, can be effectively removed and a thickness required by each of the first re-crystallization layer 210 and the second re-crystallization layer 220 can be easily obtained, compared to when each of the first re-crystallization layer 210 and the second re-crystallization 220 contains the third element. Since the second element is an interstitial impurity, the first re-crystallization layer 210 and the second re-crystallization layer 220 may have a relatively stable state. In contrast, since the third element is a substitutional impurity, when each of the first re-crystallization layer 210 and the second re-crystallization layer 220 contains the third element, electrical characteristics of structures formed in or positioned adjacent to the first re-crystallization layer 210 and the second re-crystallization layers 220, for example, transistors, can be improved, compared to when each of the first re-crystallization layer 210 and the second re-crystallization layer 220 contains the second element. Furthermore, since the third element can adjust the re-crystallization speed during an anneal process of converting an amorphous layer into a re-crystallization layer, the third element can improve the process efficiency and yield.

For another example, the first re-crystallization layer 210 and the second re-crystallization layer 220 may contain the second and third elements, respectively, both of which are different from the first element. In this case, the characteristics of having the second element and the characteristics of having the third element can be obtained at the same time, and the characteristics can be controlled according to the amounts of the second and third elements contained in the respective layers.

Hereafter, referring to FIGS. 1 and 2, the image sensor including the first re-crystallization layer 210 and the second re-crystallization layer 220 will be described in detail.

According to the embodiment of the present invention, the unit pixel 110 of the image sensor may include the light receiving region 230, the readout region 250, and an isolation structure 260. The light receiving region 230 may generate a photo charge according to an incident light, the readout region 250 may output an image reset signal and an image signal corresponding to the photo charge generated by the light receiving region 230, and the isolation structure 260 may be formed in the substrate 200 to isolate adjacent structures, for example, the light receiving region 230 and the readout region 250, from each other.

The first surface S1 of the substrate 200 may be set to the front side, and the second surface S2 may be set to the back side. The second surface S2 of the substrate 200 may serve as a light receiving surface of the photoelectric conversion element 240. The substrate 200 may include a semiconductor substrate. The semiconductor substrate may have a single crystal state and include a corporate body of the first elements. The first element may include silicon (Si). The substrate 200 may include a substrate thinned through a thinning process. For example, the substrate 200 may include a thinned single-crystal bulk silicon substrate.

The isolation structure 260 may include a trench-type isolation layer. The trench-type isolation layer may include the trench 262 formed at the first surface S1 of the substrate 200 and an insulating layer 264 buried in the trench 262. The trench 262 may be formed by etching the substrate 200 using a mask pattern (not illustrated) formed on the first surface S1 of the substrate 200 as an etch barrier. At this time, the corners of the trench 262 may be rounded by the first re-crystallization layer 210, reducing a concentration of the defects or electric fields at the rounded corners of the trench 262. The insulating layer 264 buried in the trench 262 may include any one or combinations of oxide, nitride, and oxynitride.

The light receiving region 230 may include the photoelectric conversion element 240 and a transfer transistor Tx. The photoelectric conversion element 240 may generate a photo charge according to incident light, and the transfer transistor Tx may transfer the photo charge generated by the photoelectric conversion element 240 to a floating diffusion FD in response to a transfer signal applied to a transfer gate TG. The transfer gate TG may be formed on the first surface S1 of the substrate 200, and the photoelectric conversion element 240 and the floating diffusion FD may serve as the source and drain of the transfer transistor Tx, respectively.

The photoelectric conversion element 240 may include a photo diode. Specifically, the photoelectric conversion element 240 may have a structure in which a first impurity region 242 and a second impurity region 244 having different conductive types vertically overlap each other. The first impurity region 242 may be set to a P-type impurity region and the second impurity region 244 may be set to an N-type impurity region. The first impurity region 242 may be in contact with the first surface S1 of the substrate 200. The second impurity region 244 may be extended to the bottom of the readout region 250 to increase the light receiving area. The second impurity region 244 may be in contact with the second surface S2 of the substrate 200. On the other hand, the second impurity region 244 may be isolated from the second surface S2 of the substrate 200 in a direction vertical to the substrate 200. When a plurality of the defects, which are not removed through a post-treatment, are present at the second surface S2 of the substrate 200, the second impurity region 244 may be isolated from the second surface S2 of the substrate 200 to prevent a characteristic degradation due to the defects. In the present embodiment, however, since the second re-crystallization layer 220 is formed, the second impurity region 244 may be in contact with the second surface S2 of the substrate 200.

In the embodiment of the present invention, the photoelectric conversion element 240 may include the photo diode. However, the present embodiment is not limited thereto. The photoelectric conversion element 240 may include any one or combinations of a photo transistor, photo gate, and pinned photo diode (PPD), in addition to the photo diode.

In the light receiving region 230, the dark current is generated mainly at the first surface S1 and the second surface S2 of the substrate 200 and the side and bottom surfaces of the trench 262, where a plurality of the defects occur during the process. The image sensor may include the first re-crystallization layer 210 and the second re-crystallization layer 220 to remove the defects that are present at the side and bottom surfaces of the trench 262 and the first surface S1 and the second surface S2 of the substrate 200. Surface S1 and surface S2 are in contact with the photoelectric conversion element 240. Therefore, the dark current and occurrence of noise, which is caused by the dark current, can be prevented.

The readout region 250 may generate and output the image reset signal and the image signal corresponding to the photo charge generated by the light receiving region 230. For this operation, the readout region 250 may include an active region 252, defined by the isolation structure 260 and a plurality of pixel transistors formed in the active region 252. Furthermore the readout region 250 may include the well 254 formed in the substrate 200, corresponding to the active region 252. The well 254 may include a P-type impurity region. The well 254 may be in contact with the first surface S1 of the substrate 200. The bottom surface of the well 254 may be positioned at a lower level than the bottom surface of the trench 262, and isolated from the second impurity region 244 of the photoelectric conversion element 240 extended to the bottom of the readout region 250. The plurality of pixel transistors may include a reset transistor Rx, a driver transistor Dx, and a select transistor Sx. The reset transistor Rx, the driver transistor Dx, and the select transistor Sx may share one active region 252, and include a reset gate RG a driver gate DG, and a select gate SG, respectively. The reset transistor Rx may reset the floating diffusion FD in response to a reset signal applied to the reset gate RG. The driver transistor Dx may generate an output signal corresponding to the photo charge stored in the floating diffusion FD, that is, the image signal and the image reset signal. The select transistor Sx may output the image signal and the image reset signal to a column line (not illustrated) in response to a select signal applied to the select gate SG through a row line (not illustrated).

In the readout region 250, the dark current may be generated mainly at the first surface S1 of the substrate 200 and the side and bottom surfaces of the trench 262 that are in contact with the well 254. According to the embodiment of the present invention, the image sensor may include the first re-crystallization layer 210 to remove the defects, which are present at the first surface S1 of the substrate 200 and the side and bottom surfaces of the trench 262 that are in contact with the well 254. Therefore, the dark current and occurrence of noise, which is caused by the dark current, can be prevented. Furthermore, when the first re-crystallization layer 210 contains the third element therein, the operation characteristic of the readout region 250 can be improved. For example, when the well 254 is a P-well, the pixel transistors of the readout region 250 may include NMOS transistors, and the first re-crystallization layer 210 may contain carbon as the third element, which has a smaller lattice constant than silicon. In this case, the carbon contained in the first re-crystallization layer 210 disposed in the readout region 250 may cause tensile stress to improve the carrier mobility of the NMOS transistors.

Although not illustrated in the drawings, the image sensor may include a color separation element and a light focusing element, both of which are formed on the second surface S2 of the substrate 200. The color separation element may include a color filter, and the light focusing element may include a hemispherical lens.

As described above, the image sensor may include the first re-crystallization layer 210 and the second re-crystallization layer 220 that remove the defects formed at the surfaces S1 and S2 of the substrate 200 and remove the defects formed under the surfaces S1 and S2 of the substrate 200 during the process, thereby effectively preventing the dark current and occurrence of noise, which is caused by the dark current. Furthermore, the process can improve the electrical characteristics of the structures, which are in contact with or adjacent to the first re-crystallization layer 210 and the second re-crystallization layer 220.

Hereafter, an image sensor including the above-described unit pixels 110 will be described with reference to FIG. 3.

Figure 3:
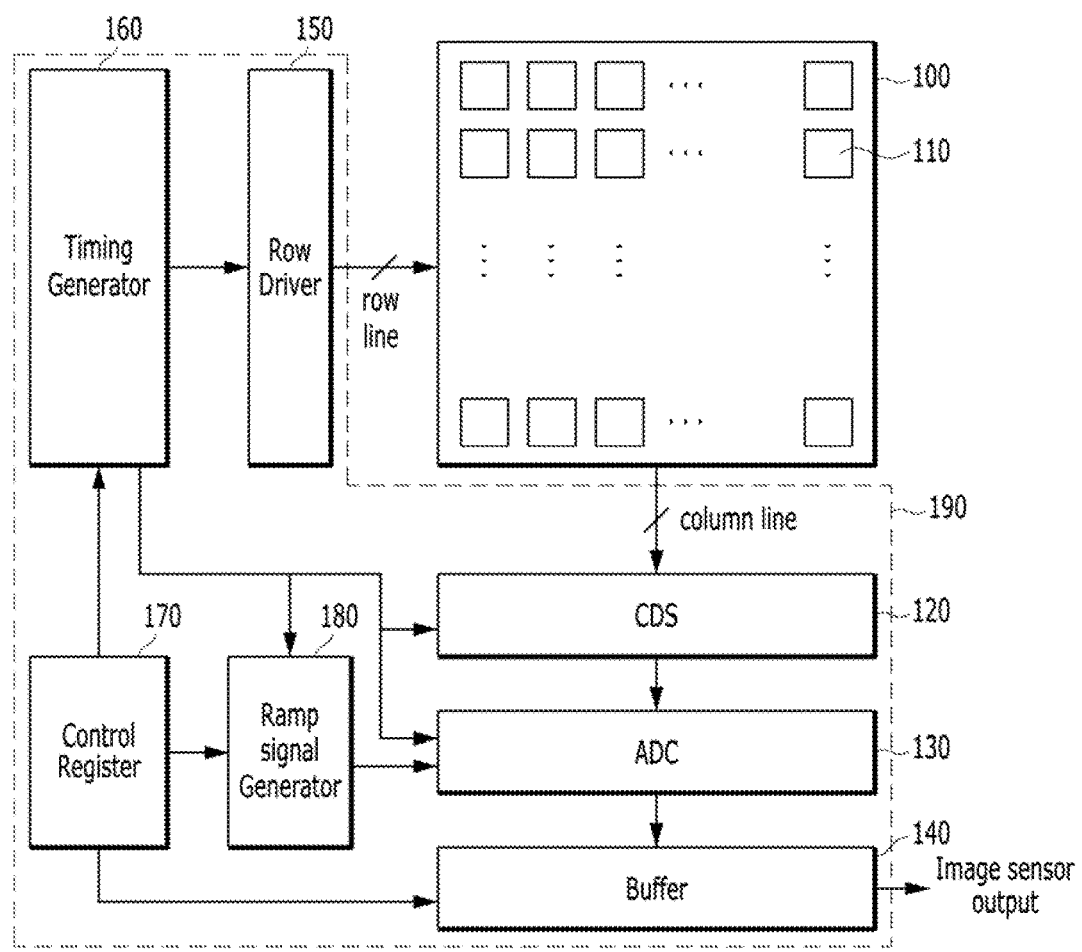
FIG. 3 is a block diagram schematically illustrating an image sensor in accordance with an embodiment of the present invention.

FIG. 3 is a block diagram schematically illustrating an image sensor in accordance with an embodiment of the present invention.

As illustrated in FIG. 3, the image sensor may include a pixel array 100 and a peripheral circuit 190. The pixel array 100 may have a plurality of the unit pixels 110 arranged in a matrix structure.

At this time, a predetermined structure, for example, a first re-crystallization layer (210 of FIG. 2) formed at a first surface (S1 of FIG. 2) of a substrate (200 of FIG. 2) including a plurality of trenches (262 of FIG. 2) may correspond to the pixel array 100, or the pixel array 100 and the peripheral circuit 190. Furthermore, a second re-crystallization layer (220 of FIG. 2) formed at a second surface (S2 of FIG. 2) of the substrate 200 may correspond to the pixel array 100, the peripheral circuit 190, or the pixel array 100 and the peripheral circuit 190.

The peripheral circuit 190 may include a correlated double sampling (CDS) 120, an analog-to-digital converter (ADC) 130, a buffer 140, a row driver 150, a timing generator 160, a control register 170, and a ramp signal generator 180. The pixel array 100 may be coupled to the row driver 150 through a plurality of row lines, and coupled to the correlated double sampling 120 through a plurality of column lines. The first re-crystallization layer (210 of FIG. 2) and the second re-crystallization layer (220 of FIG. 2) may be formed to selectively correspond to specific components within the peripheral circuit 190.

The timing generator 160 generates on or more control signals for controlling the respective operations of the row driver 150, the correlated double sampling 120, the analog-to-digital converter 130, and the ramp signal generator 180. The control register 170 generates one or more control signals for controlling the respective operations of the ramp signal generator 180, the timing generator 160, and the buffer 140.

The row driver 150 drives the pixel array 100 by the unit of row line. For example, the row driver 150 may generate a select signal for selecting any one row line from the plurality of row lines. The plurality of row lines are coupled with the plurality of unit pixels 110, respectively. One row line is coupled to each of the plurality of pixels.

Each of the plurality of unit pixels 110 senses incident light, and outputs an image reset signal and an image signal to the correlated double sampling 120 through one of the corresponding plurality of column lines. The correlated double sampling 120 samples each of the image reset signal and the image signal received therein. The plurality of unit pixels 110 are coupled to the plurality of column lines, respectively. One column line is coupled to each of the plurality of unit pixels 110. The analog-to-digital converter 130 outputs a comparison signal by comparing a ramp signal, which the ramp signal generator 180 outputs, to a sampling signal, which the correlated double sampling 120 outputs. The analog-to-digital converter 130 outputs a count value to the buffer 140 by counting a level transition time of the comparison signal according to a clock signal from the timing generator 160. The ramp signal generator 180 may operate under control of the timing generator 160.

The buffer 140 outputs resultant signals by storing a plurality of digital signals corresponding to the count values, which the analog-to-digital converter 130 outputs, and by sensing and amplifying the respective digital signals. Thus, the buffer 140 may include a memory (not shown) and a sense amplifier (not shown). The memory stores the count values associated with the signals that the plurality of unit pixels 110 outputs. The sense amplifier senses and amplifies the respective count values that the memory outputs.

Hereafter, a method of fabricating an image sensor illustrated in FIGS. 1 and 2 will be described in detail with reference to FIGS. 4A to 4F.

FIGS. 4A to 4F are cross-sectional views illustrating the method of fabricating the image sensor in accordance with an embodiment of the present invention. FIGS. 4A to 4F show the cross-sectional views taken along the like I-I' of FIG. 1.

Figure 4A:
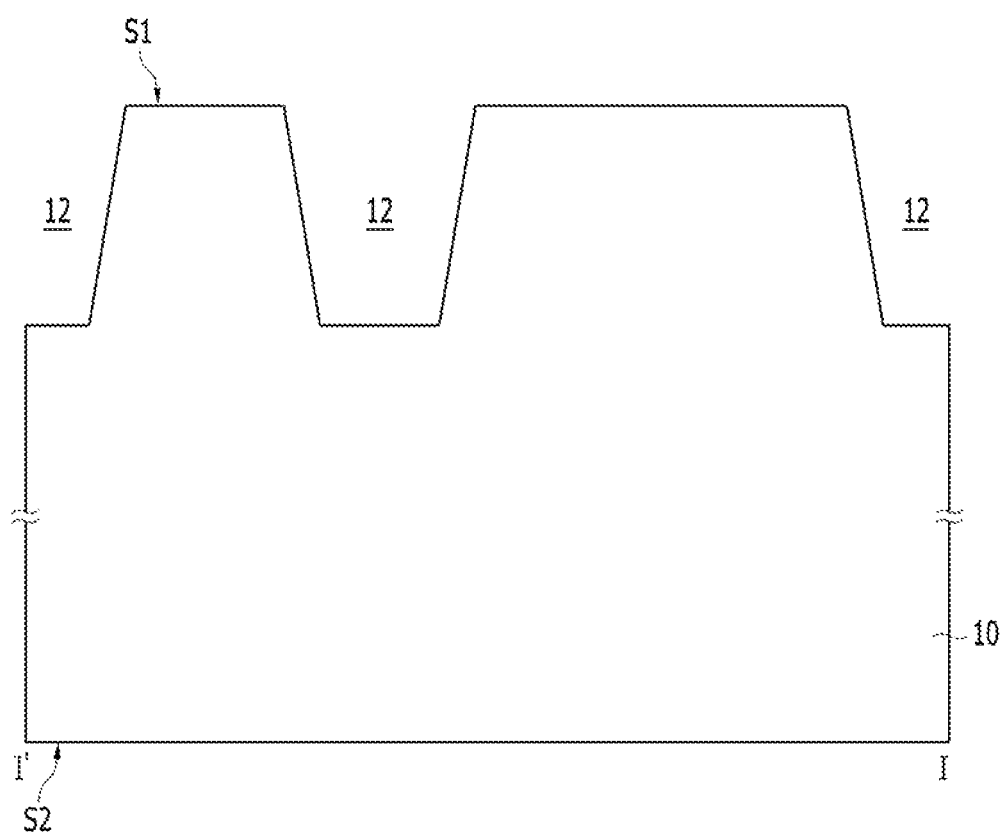
FIGS. 4A to 4F are cross-sectional views illustrating a method of fabricating an image sensor in accordance with an embodiment of the present invention.

As illustrated in FIG. 4A, a substrate 10 may be prepared, the substrate 10 having a first surface S1 and a second surface S2 facing the first surface S1. The first surface S1 may be set to a front side of the substrate 10, and the second surface S2 may be set to a back side of the substrate 10 or a light receiving surface of a photoelectric conversion element, which is to be formed through a subsequent process. The substrate 10 may include a semiconductor substrate. The semiconductor substrate may have a single crystal state, and may include a corporate body of first elements. When the first element includes a silicon, the substrate 10 may include a single-crystal bulk silicon substrate.

Then, a trench 12 may be formed by etching the substrate 10 using a mask pattern (not illustrated) formed on the first surface S1 of the substrate 10 as an etch barrier. The trench 12 may be formed for isolation. The etching process for forming the trench 12 may include a dry etching process. When the etching process is completed, the trench 12 may be formed to have angled corners.

During the above-described process, defects may be formed at the first surface S1 of the substrate 10, which includes bottom and side surfaces of the trench 12 and in the substrate 10 under the first surface S1.

Figure 4B:
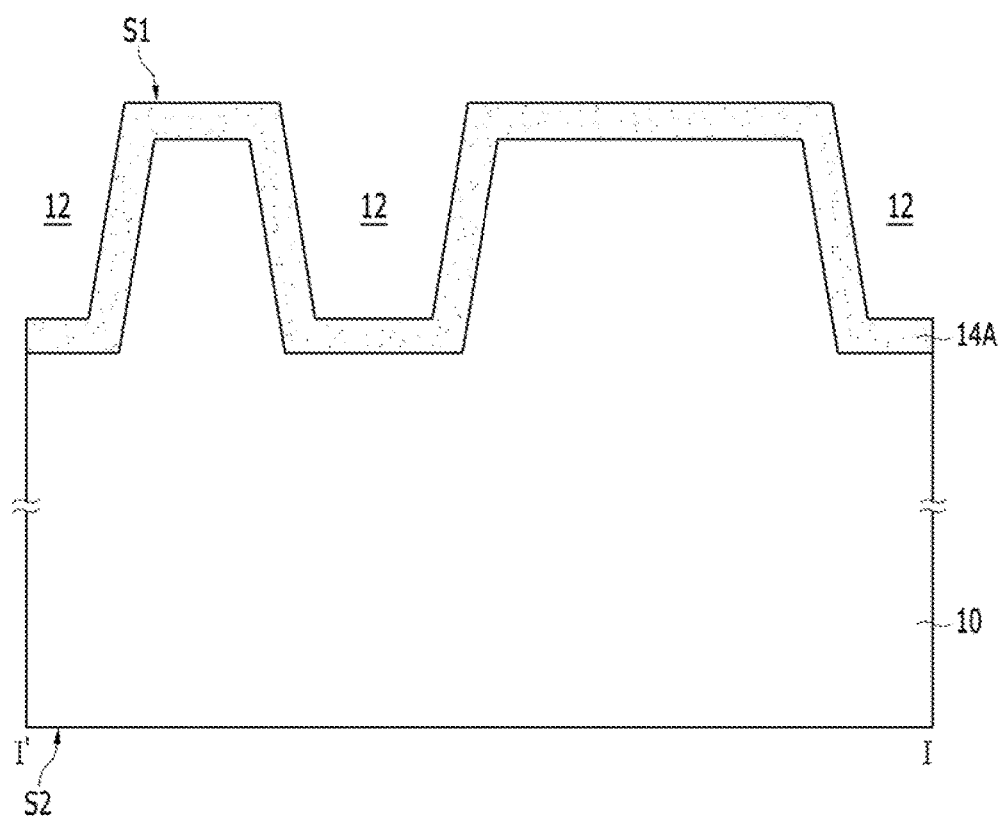

As illustrated in FIG. 4B, a primary ion-implantation process may be performed to form a first amorphous layer 14A to remove the defects formed under the first surface S1 of the substrate 10 during the process. The first amorphous layer 14A may be formed in the substrate 10 to be in contact with the bottom and side surfaces of the trench 12 and the first surface S1 of the substrate 10. The primary ion-implantation process to form the first amorphous layer 14A may use one or more kinds of elements different from the first element constituting the substrate 10. When the first element is silicon, the one or more kinds of elements different from the first element may include one or more of metalloid elements, nonmetallic elements, and combinations thereof among group 14 to 18 elements. Specifically, the primary ion-implantation process may be performed using a second or third element different from the first element, or performed using the second and third elements. Since the kinds and characteristics of the second and third elements have been described in detail with reference to FIGS. 1 and 2, the detailed descriptions thereof are omitted herein.

Figure 4C:
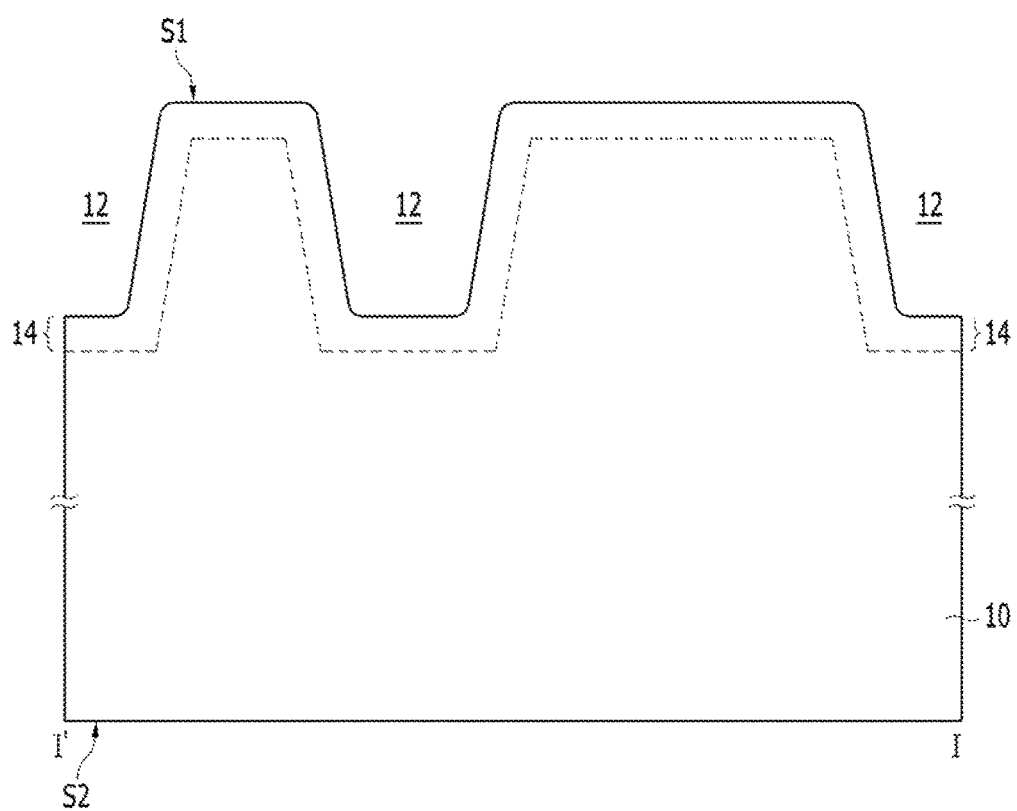

As illustrated in FIG. 4C, a primary anneal process may be performed to convert the first amorphous layer 14A (shown in FIG. 4B) into a first re-crystallization layer 14. The primary anneal process may be performed at a high temperature of 900° C. or more and under an atmosphere of $N_2$, $H_2$, $D_2$, or Ar. The primary anneal process may include a variety of publicly known methods.

Therefore, while the trench 12 is formed, the defects formed at the first surface S1 of the substrate 10, or in particular, the defects formed under the first surface S1 of the substrate 10, can be effectively removed. After the primary anneal process is completed, the element implanted into the substrate 10 through the primary ion-implantation process may remain in the first re-crystallization layer 14, thereby improving the physical and electrical characteristics.

After the primary anneal process is completed, the trench 12 may have rounded corners. Such a structure may be formed while the first re-crystallization layer 14 is formed through the primary ion-implantation process and the primary anneal process.

Figure 4D:
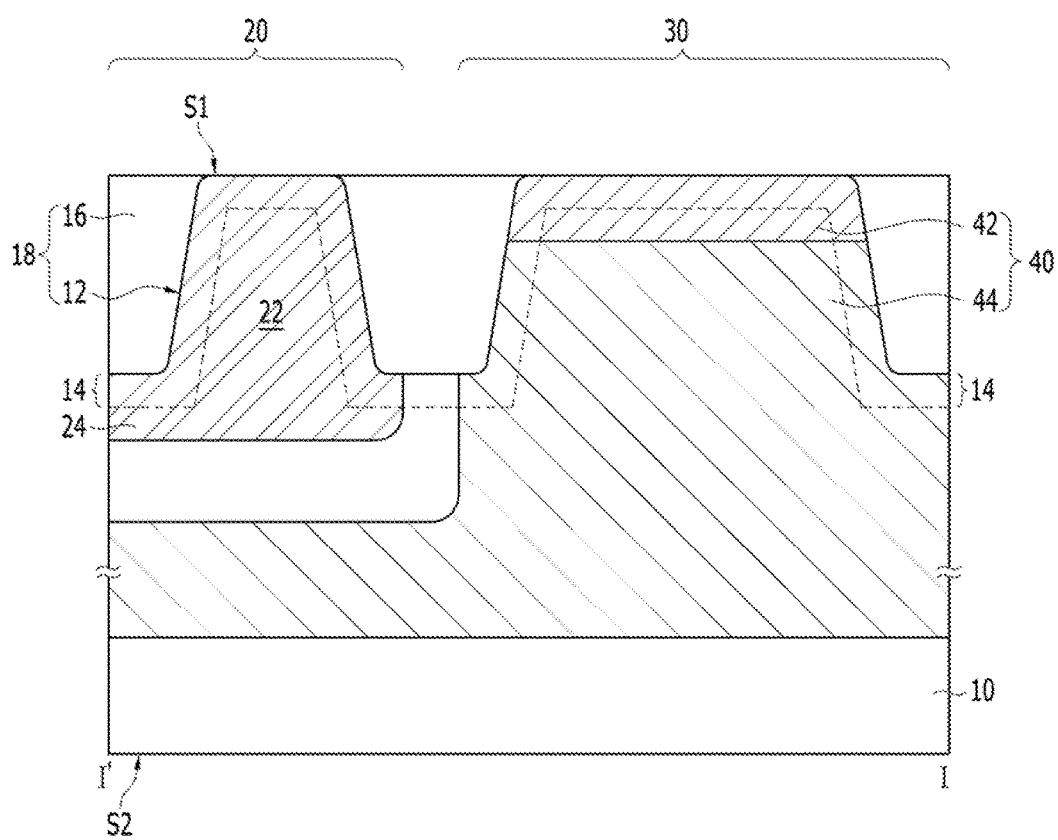

As illustrated in FIG. 4D, an insulating layer 16 may be buried in the trench 12 to form a trench-type isolation structure 18. The process of burying the insulating layer 16 may be performed through a series of processes of forming the insulating layer 16 on the first surface S1 of the substrate 10 to fill the trench 12, and then performing a planarization process until the first surface S1 of the substrate 10 is exposed. The planarization process may include a chemical mechanical polishing (CMP) process. The insulating layer 16 may include any one or combinations of oxide, nitride, and oxynitride.

The trench-type isolation structure 18 may serve to isolate a light receiving region 30 from a readout region 20 in a unit pixel. Then, according to a publicly known fabrication method, a photoelectric conversion element 40 including a first impurity region 42 and a second impurity region 44 may be formed in the light receiving region 30. Furthermore, a plurality of pixel transistors and a well 24 corresponding to an active region 22 may be formed in the readout region 20. Since the light receiving region 30 including the photoelectric conversion element 40, and the readout region 20 including the well 24 have been described in detail with reference to FIGS. 1 and 2, the detailed descriptions thereof are omitted herein.

Figure 4E:
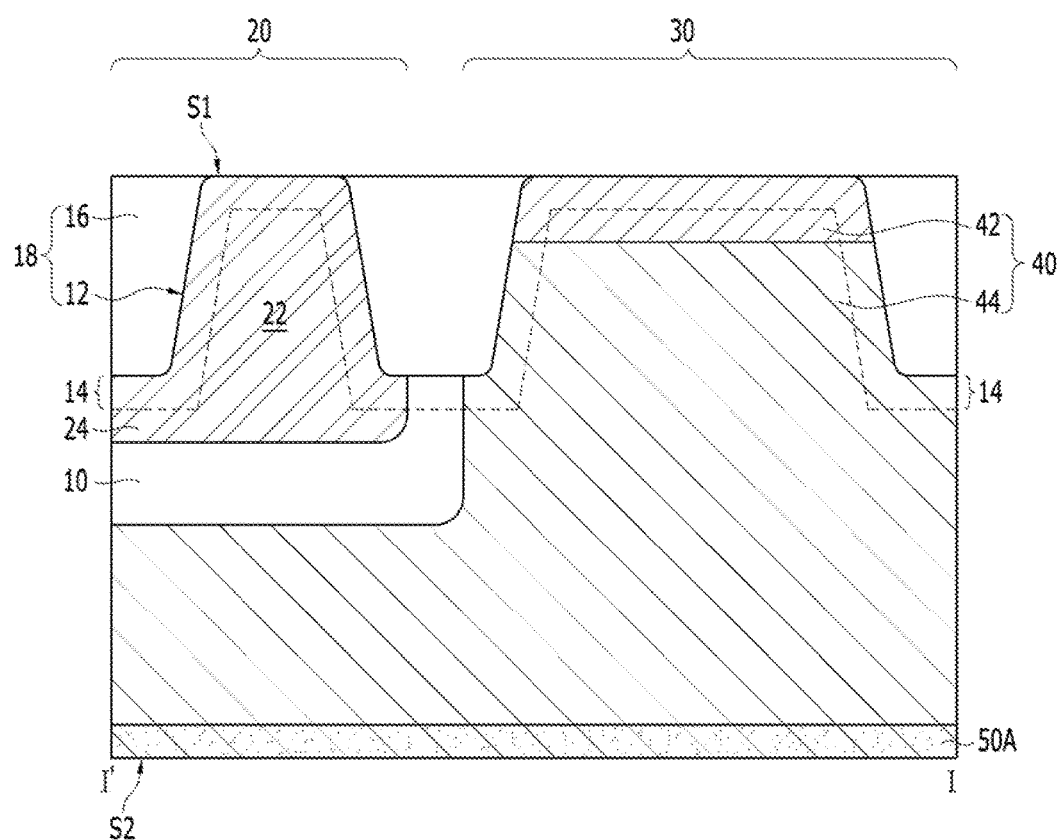

As illustrated in FIG. 4E, a thickness of the substrate 10 may be reduced by performing a thinning process on the second surface S2 of the substrate 10. The thinning process may be performed until the second impurity region 44 of the photoelectric conversion element 40 is exposed. The thinning process may cause the defects at the second surface S2 of the substrate 10 and under the second surface S2 of the substrate 10.

Then, to remove the defects formed under the second surface S2 of the substrate 10 by the thinning process, a secondary ion-implantation process may be performed to form a second amorphous layer 50A. The second amorphous layer 50A may be formed in the substrate 10 to be in contact with the second surface S2 of the substrate 10. The secondary ion-implantation process for forming the second amorphous layer 50A may use one or more kinds of elements different from the first element constituting the substrate 10. When the first element is silicon, the one or more of elements different from the first element may include one or more of metalloid elements, nonmetallic elements, and combinations thereof among group 14 to 18 elements. Specifically, the secondary ion-implantation process may be performed using the second or third element different from the first element, or performed using the second and third elements. Since the kinds and characteristics of the second and third elements have been described in detail with reference to FIGS. 1 and 2 the detailed descriptions thereof are omitted herein.

Figure 4F:
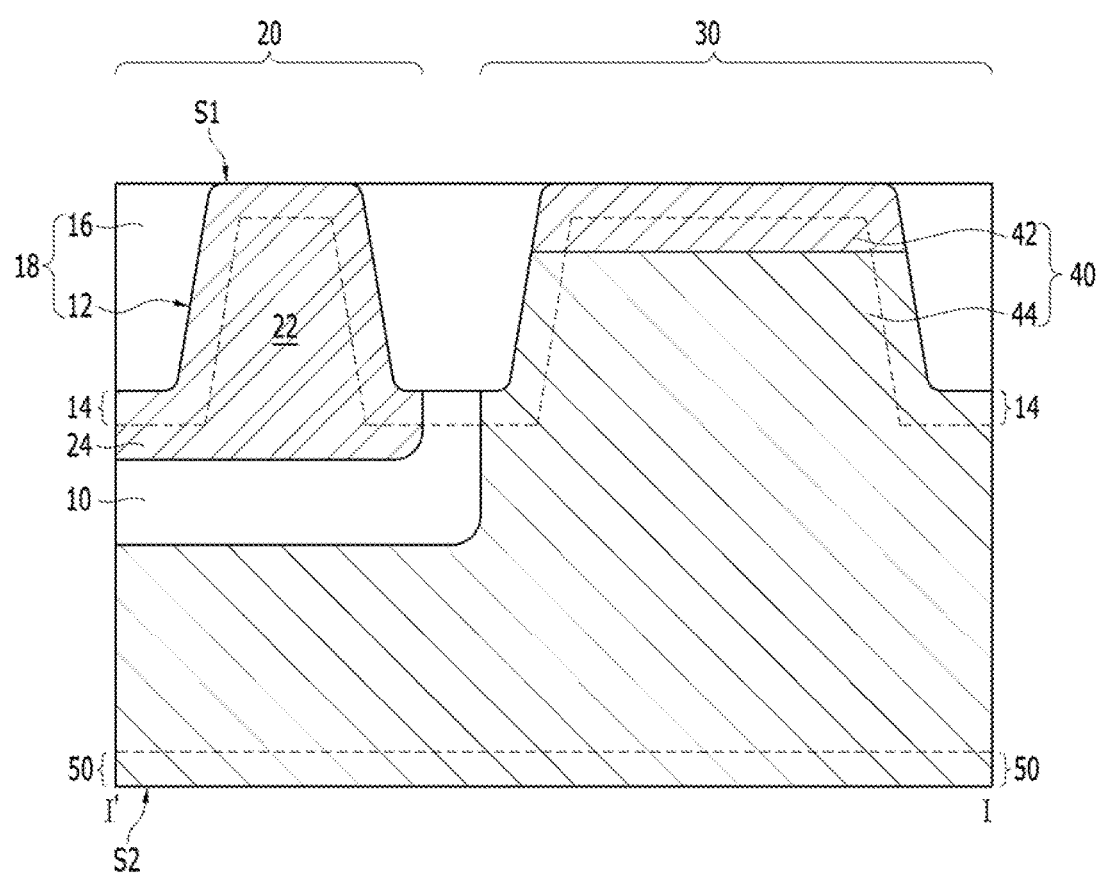

As illustrated in FIG. 4F, a secondary anneal process may be performed to convert the second amorphous layer 50A into a second re-crystallization layer 50. The secondary anneal process may be performed for a shorter time than the primary anneal process to prevent a damage of the structure, which has been already formed. The secondary anneal process may include a variety of publicly known methods.

Thus, the defects caused by the thinning process, or in particular, the defects formed under the second surface S2 of the substrate 10, can be removed. After the secondary anneal process is completed, the element implanted into the substrate 10 through the secondary ion-implantation process may remain in the second re-crystallization layer 50, thereby improving the physical and electrical characteristics.

Then, although not illustrated, the image sensor can be completed through a publicly known fabrication method. For example, a color separation element including a color filter, and a light focusing element including a hemispherical lens may be sequentially formed on the second surface S2 of the substrate 10.

According to the embodiment of the present invention the image sensor may include the first re-crystallization layer 14 and the second re-crystallization layer 50 to remove the defects formed at the surface of the substrate 10 and to remove the defects formed under the surfaces S1 and S2 of the substrate, thereby effectively preventing a dark current and occurrence of noise, which is caused by the dark current. Furthermore, the electrical characteristics of the structures, which are in contact with or positioned adjacent to the re-crystallization layer, can be improved.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a substrate including a first element;
a trench formed in the substrate, the trench defining a light receiving region and a readout region isolated from each other by the trench;
an impurity region formed in the substrate in contact with the trench; and
a re-crystallization layer formed in the substrate in contact with bottom and side surfaces of the trench and a surface of the substrate, the re-crystallization layer having a first portion disposed in the light receiving region and a second portion disposed in the readout region,
wherein the first portion of the re-crystallization layer includes a second element,
wherein the second portion of the re-crystallization layer includes a third element which is different from the second element, and
wherein the second and third elements are different from the first element wherein the second element contained in the first re-crystallization layer disposed in the light receiving region includes at least one of helium (He), neon (Ne), argon (Ar), krypton (Kr), xenon (Xe), and radon (Rn); and
wherein the third element contained in the first re-crystallization layer disposed in the readout region includes at least one of carbon (C), silicon (Si), germanium (Ge), nitrogen (N), oxygen (O), and fluorine (F).

2. The image sensor of claim 1, further comprising:
a photoelectric conversion element formed in the substrate,
wherein the photoelectric conversion element comprises the impurity region.

3. The image sensor of claim 1, wherein the trench has rounded corners.

4. The image sensor of claim 1, wherein the re-crystallization layer is continuously formed along the surface of the substrate, which includes the bottom and side surfaces of the trench.

5. The image sensor of claim 1, wherein the first element comprises silicon, and the second and third elements are selected from the group comprising metalloid elements, nonmetallic elements, and combinations thereof among group 14 to 18 elements.

6. An image sensor comprising:
a substrate having a first surface and a second surface facing the first surface, the substrate including a first element;
a trench formed at the first surface of the substrate, the trench dividing the substrate into a light receiving region and a readout region;
an impurity region formed in the substrate in contact with the trench;
a first re-crystallization layer formed in the substrate in contact with bottom and side surfaces of the trench and the first surface of the substrate, the first re-crystallization layer having a first portion disposed in the light receiving region and a second portion disposed in the readout region; and
a second re-crystallization layer formed in the substrate in contact with the second surface of the substrate,
wherein each of the first and second re-crystallization layers contains second and third elements which are different from each other and different from the first element, and
wherein the first re-crystallization layer disposed in the light receiving region contains the second element and the first re-crystallization layer disposed in the readout region contains the third element wherein the second element contained in the first re-crystallization layer disposed in the light receiving region includes at least one of helium (He), neon (Ne), argon (Ar), krypton (Kr), xenon (Xe), and radon (Rn), and wherein the third element contained in the first re-crystallization layer disposed in the readout region includes at least one of carbon (C), silicon (Si), germanium (Ge), nitrogen (N), oxygen (O), and fluorine (F).

7. The image sensor of claim 6, further comprising:
a photoelectric conversion element formed in the substrate, wherein the photoelectric conversion element comprises the impurity region.

8. The image sensor of claim 6, wherein the trench has rounded corners.

9. The image sensor of claim 6, wherein the first re-crystallization layer is continuously formed along the first surface of the substrate, which includes the bottom and side surfaces of the trench, and the second re-crystallization layer is continuously formed along the second surface of the substrate.

10. The image sensor of claim 6, wherein the first element comprises silicon, and the second and third elements are selected from the group comprising metalloid elements, nonmetallic elements, and combinations thereof among group 14 to 18 elements.

11. The image sensor of claim 6,
wherein the second and third elements contained in the second re-crystallization layer include at least one of helium (He), neon (Ne), argon (Ar), krypton (Kr), xenon (Xe), and radon (Rn).

12. An image sensor comprising:
a substrate having a light receiving region and a readout region;
a first re-crystallization layer formed in the light receiving region and the readout region in the substrate to be in contact with a trench and a first surface of the substrate,
wherein:
the light receiving region has a photoelectric conversion element,
the readout region has a transistor,
the substrate comprises a first element,
the first re-crystallization layer disposed in the light receiving region comprises the first element and a second element different from the first element,
the first re-crystallization layer disposed in the readout region comprises the first element and a third element different from the first and second elements wherein the second element includes at least one of helium (He), neon (Ne), argon (Ar), krypton (Kr), xenon (Xe), and radon (Rn), and
wherein the third element includes at least one of carbon (C), silicon (Si), germanium (Ge), nitrogen (N), oxygen (O), and fluorine (F).

13. The image sensor of claim 12, further comprising:
a second re-crystallization layer formed in the substrate to be in contact with a second surface of the substrate opposite to the first surface of the substrate,
wherein the second re-crystallization layer comprises the first element and the third element.

14. The image sensor of claim 12, further comprising:
the trench is between the light receiving region and the readout region,
wherein the light receiving region and the readout region are isolated from each other by the trench.

* * * * *